United States Patent [19]

Wade

[11] Patent Number: 4,826,720

[45] Date of Patent: May 2, 1989

[54] DIRECTLY SOLDERABLE THREE-DIMENSIONAL ELECTRICALLY CONDUCTIVE CIRCUIT COMPONENTS AND PROCESS FOR THE PREPARATION THEREOF

[75] Inventor: Robert J. Wade, Louisville, Ky.

[73] Assignee: General Electric Company, Selkirk, N.Y.

[21] Appl. No.: 795,978

[22] Filed: Nov. 7, 1985

[51] Int. Cl.$^4$ .................. B32B 3/00; C23C 14/34
[52] U.S. Cl. .................. 428/209; 428/473.5; 428/901; 204/192.14; 204/192.15
[58] Field of Search ....... 204/192 R, 192 EC, 192.14, 204/192.15, 192.17; 427/98, 96; 428/209, 473.5, 901

[56] References Cited

U.S. PATENT DOCUMENTS

| | | | |
|---|---|---|---|
| 4,101,698 | 7/1978 | Dunning et al. ................ | 428/209 X |
| 4,294,877 | 10/1981 | Graham ........................... | 428/209 |
| 4,313,995 | 2/1982 | Delgadillo ....................... | 428/209 X |
| 4,344,996 | 8/1982 | Banks et al. ............. | 204/192 EC X |
| 4,364,792 | 12/1982 | Gliem et al. ............. | 204/192 EC X |
| 4,466,874 | 8/1984 | Belke, Jr. et al. ............. | 204/192 EC |
| 4,482,598 | 11/1984 | Ishii et al. ....................... | 428/209 X |
| 4,525,261 | 6/1985 | Hotta et al. .................. | 204/192 EC |

Primary Examiner—Nam X. Nguyen
Attorney, Agent, or Firm—Hedman, Gibson, Costigan & Hoare

[57] ABSTRACT

Novel directly solderable three-dimensional electrically conductive circuit components are made by forming firmly adherent metal coatings on smooth thermoplastic substrates, e.g., polyether imides, by sputtering the metal directly onto the substrate, without any surface preparation or treatment of the substrate, under sputtering conditions which cause at least a portion of the sputtered metal, e.g., copper, to be imbedded into and below the substrate surface. Another metal coating can be provided by sputtering, or electro or electroless deposition over the sputter-deposited coating.

42 Claims, 1 Drawing Sheet

U.S. Patent May 2, 1989 4,826,720
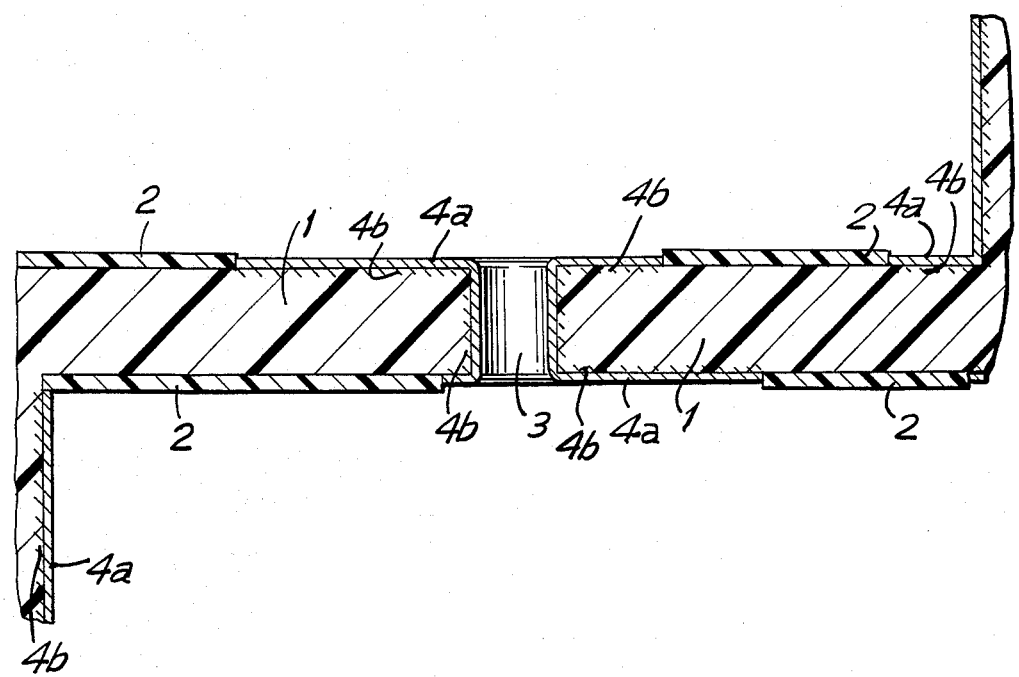

DIRECTLY SOLDERABLE THREE-DIMENSIONAL ELECTRICALLY CONDUCTIVE CIRCUIT COMPONENTS AND PROCESS FOR THE PREPARATION THEREOF

FIELD OF THE INVENTION

This invention relates to components made by depositing a selected metal pattern onto a substrate and methods by which they are made therefrom; in particular, the substrate being a polyetherimide, a bismaleimide or a polyether ether ketone. More particularly, the invention relates to directly solderable three-dimensional electrically conductive circuit components by sputtering a metal onto a substrate under conditions which effect elevated temperatures at the substrate surface thereby enhancing the adhesion of the sputtered metal to the substrate.

DESCRIPTION OF THE PRIOR ART

It has been known for some time that metals, e.g., copper, gold, chromium, nickel and the like can be deposited in a selected pattern upon the surface of substrates, chiefly epoxy resins and modified epoxy resins, to form articles useful, for example, in the manufacture of printed circuit boards.

Typically, two methods for the selective placement of metals on a substrate have been employed: the subtractive method and the additive method.

In the subtractive method, an overall coating of the desired metal is applied to a substrate after a pre-treatment of the substrate designed to enhance adhesion of the metal thereto during later process steps. A photoresist is then applied over the entire metal surface and exposed in accordance with whatever pattern of metal is ultimately desired to be left on the substrate. The unexposed photoresist is removed in a development step and the metal-coated substrate is passed through an etching system which removes the metal from the areas no longer protected by the photoresist. The protective, exposed photoresist is then removed leaving only the desired pattern of metal upon the substrate.

A disadvantage of the subtractive method is that a relatively thick metal coating has to be applied which is mostly removed again by etching. This is uneconomical and time consuming, and moreover, for this reason, this method is not well-suited for precision networks. Furthermore, the strong underetchings connected with the use of the subtractive method effects a practical limitation of the metal pattern width, so that widths of less than 100 um. can not readily be made following this method.

Variations of the subtractive method have been disclosed in attempts to overcome these problems.

Sato, U.S. Pat. No. 4,193,849 discloses a method of making a "raw board" for use in printed circuits, compising the steps of subjecting a very thin film to vapor deposition and thereafter electrochemically depositing a metal on the vapor-deposited metal. The resulting raw board, however, suffers from the same underetching problem which attends the typical subtractive techniques, and moreover, the ultra thin film used as a substrate, i.e. 50 u. or less, does not lend itself to soldering. The high temperatures attending the soldering technique will melt the long, flexible, rollable film required by Sato.

Kobayashi, et al, U.S. Pat. No. 4,121,007 disclose a method whereby a very thin, i.e. 5-10 u., polymer interlayer is adhered to a base material. The interlayer is optionally sputter-deposited with an overall metallic coating and photo-exposed to form dispersed and undispersed metal areas. The unexposed areas are thereafter built up with a further layer of metal by electroless deposition or electrodeposition techniques. The resulting circuitry patterns would thus also be severely affected by soldering techniques due to the thinness and low melt temperatures of the polymer interlayers to which the metal pattern is dispersed.

For the above reasons, various additive methods, where the metal is deposited directly where desired, have been devised in attempts to overcome these problems.

These additive methods, however, are generally characterized by steps directed toward ensuring that the deposited metal adheres sufficiently to the substrate.

Dodd, et al., U.S. Pat. No. 4,354,911, disclose a method for selectively depositing a metal on a substrate wherein after the masking step the substrate itself is sputter-etched and cleaned over the entire desired deposition pattern prior to any deposition of the metal, and optionally, wherein prior to the application of any masking material the entire surface of the substrate is swelled in a suitable solvent and thereafter etched. These etching and swelling procedures are designed to enhance adhesion of the subsequently deposited materials.

Kumagai, et al., U.S. Pat. No. 4,402,998, disclose a method for depositing an adherent metal coating on a substrate wherein the substrate is baked at an elevated temperature to degas its surface and then sputter-etched across its entire surface in order to promote adhesion of the subsequently deposited metals.

Bahrle, et al., U.S. Pat. No. 4,521,280, disclose a method for selectively depositing a metal on a substrate wherein a sacrificial metal foil is laminated to the substrate material and subsequently etched off. The dendritic structure of the metal foil is duplicated in the surface of the substrate, providing the required roughened surface which enhances adhesion for the subsequently applied photoresist masking material and, inherently, for the subsequently sputtered metal pattern.

Thus, regardless of the process by which a metal is selectively deposited upon the surface of a substrate by the prior art methods, each process is characterized by the additional steps necessary to effect proper adhesion between the surface and the metal deposited thereon.

SUMMARY OF THE INVENTION

In essence, the present invention contemplates an article of manufacture comprising:

(I) a smooth, solderable, thermoplastic resin substrate; and (II) a firmly adherent and substantially uniform layer of at least one metal deposited in a selected pattern on said substrate by sputtering; and, optionally, (III) 0% to 70% of a reinforcement contained in the substrate.

According to the present invention there is also provided a process for depositing a metal pattern on a smooth, solderable, thermoplastic substrate comprising sputtering a conductive metal in a selective pattern under sputtering conditions which provide a firmly adherent and substantially uniform deposited metal pattern on the substrate.

In another aspect, the process includes, optionally, depositing a further amount of a metal onto said sputtered metal either before or after the mask is removed.

DESCRIPTION OF THE DRAWINGS

The drawing represents a cross-sectional view of one of the preferred embodiments of the present invention showing a three-dimensional smooth, solderable, thermoplastic resin substrate having a plated throughhole and firmly adherent metal coatings selectively deposited in the through-hole and on each smooth surface of the thermoplastic. Electrical conductivity is maintained through the through hole to opposite surfaces.

In the drawings there is provided a substrate 1 of the present invention to which is applied a masking material 2 leaving areas of the substrate and the throughhole 3 exposed to subsequent sputtering deposition steps. The metal is sputtered according to the process of the present invention and deposited into the surface of the substrate as shown in 4b, in a layer above the surface 4a and similarly through the through-hole.

DETAILED DESCRIPTION OF THE INVENTION

In general, the process of this invention is carried out by first masking a smooth, solderable, thermoplastic substrate with a suitable releasably adherent material which exhibits the negative of the desired metal pattern to be deposited. Alternatively, the pattern can be formed by other ways, such as molding in a raised mechanically or chemically removable border, and the result provides the desired circuit. As used herein, the term "smooth" contemplates a thermoplastic resin surface which has been neither chemically nor physically etched or roughened. The masked substrate is then placed in any suitable sputtering apparatus, e.g., Balzers Sputtering Unit BAS 450 which has a chamber size of about 22 inches by 28 inches, containing a metal target material which will be the sputtered metal. When used herein, the term "metal" includes both suitable metals and alloys, e.g., copper, brass or stainless steel. The chamber is evacuated and back filled with any suitable inert gas, e.g., argon. The gas is then ionized to a plasma with direct voltage potential and the ionized gas bombards the metal causing metal atoms to be ejected in the direction opposite to the direction of impact of the ionized gas. The rate of ionization controls the rate of deposition of the metal and thus, ultimately, controls the thickness of the deposit. The energy of bombardment of the metal atoms or particles of an alloy, e.g., stainless steel, impacting upon the exposed portions of the substrate is controlled so as to cause the atoms to be imbedded therein and impregnate the substrate during the initial stages of the deposition. The bombardment by the atoms to effect imbedding and impregnation necessarily cause the temperature of the impacted surfaces to become elevated and is therefore distinguishable from processes encountered in some of the prior art, where melting has to be avoided to maintain adhesion. Additional amounts of the sputtered metal, or of a different metal, may thereafter be deposited by sputtering or by electroless plating or electroplating techniques.

Surface temperatures at the point of impingement of any masking material and of the exposed substrate can range from about 100° C. to about 215° C.; preferably from about 150° C. to about 215° C.; and especially preferably from about 200° C. to about 215° C. Most preferred are the processes where the surface temperature of the masking material and of the exposed substrate are not substantially less than the glass transition temperature of the smooth, solderable, thermoplastic resin employed. Typically encountered soldering temperatures are 350°–450° F.

The metal may be sputtered to any desired thickness and the mask removed, leaving the previously masked surface of the substrate immediately adjacent to the sputter-deposited metal still smooth and essentially unaltered and having thereon a firmly adherent and substantially uniform selectively deposited metallic pattern which at least partially impregnates and is imbedded into the thermoplastic, and below the adjacent essentially unaltered smooth surface. Preferred thicknesses of the sputter-deposited metal will be in excess of 400 Angstroms; especially preferred will be thicknesses in excess of 800 Angstroms.

Optionally, there may be deposited a second metal by sputtering onto the previously sputter-deposited selected metal pattern.

Also optionally, there may be deposited by electroless deposition or electrodeposition a further amount of a metal which may or may not be the same as the only, or last, sputtered metal. If the sputtered metal is present on the substrate in an electrically continuous pattern, then either electroless deposition or electrodeposition can be used to further build up a layer of metal, if so desired. In the electrodeposition process the electrically continuous sputtered metal pattern is made the cathode by any suitable means and a further amount of metal can be deposited thereon from an electrolytic solution. If the sputtered metal is not in an electrically continuous pattern, then electroless deposition of any further amount of metal, by any of the known electroless deposition procedures, is the preferred method. In practice, any smooth, solderable, thermoplastic resin substrate which can be impregnated by the bombardment of the metal atoms during the sputtering process and maintain its integrity under the elevated temperatures of the process and also, particularly, those involved during soldering, is suitable for use in the present invention. Typically these will be polyetherimides, bismaleimides, the so-called PEEK resins, which are polyether ether ketones, and the like.

Among the preferred substrates for use in the present invention are polyetherimides including, but not limited to, those of the formula:

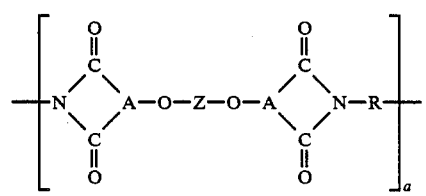

where "a" represents a whole number in excess of 1, e.g., 10 to 10,000 or more, the group —O—A is selected from:

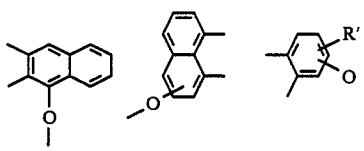

R' being hydrogen, lower alkyl or lower alkoxy, preferably the polyetherimide includes the latter —O—A group where R' is hydrogen such that the polyetherimide is of the formula:

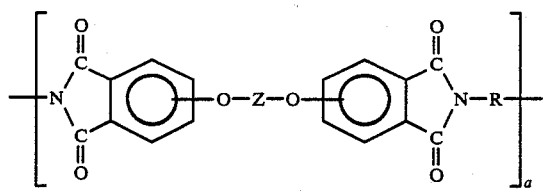

and the divalent bonds of the —O—Z—O— radical are in the 3,3+; 3,4'; 4,3' or the 4,4' position; Z is a member of the class consisting of (1)

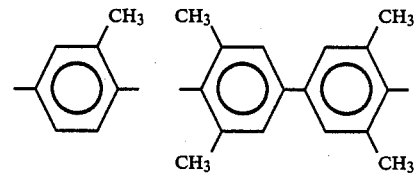

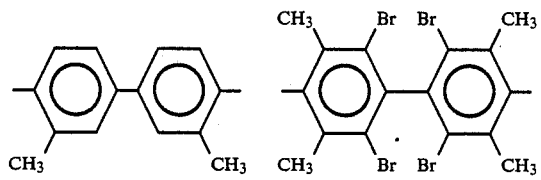

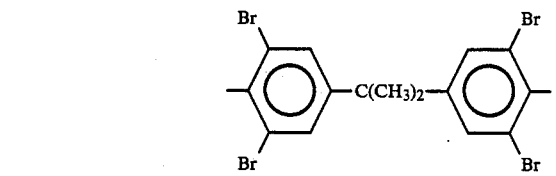

and (2) divalent organic radicals of the general formula:

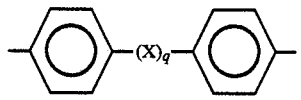

where X is a member selected from the class consisting of divalent radicals of the formulas,

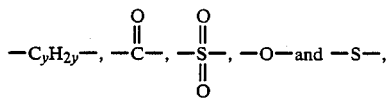

where q is 0 or 1, y is a whole number from 1 to 5, and R is a divalant organic radical selected from the class consisting of (1) aromatic hydrocarbon radicals having from 6–20 carbon atoms and halogenated derivatives thereof, (2) alkylene radicals and cycloalkylene radicals having from 2–20 carbon atoms, $C_{(2-8)}$ alkylene terminated polydiorganosiloxane, and (3) divalent radicals included by the formula

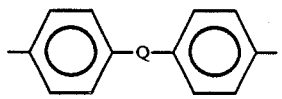

where Q is a member selected from the class consisting of

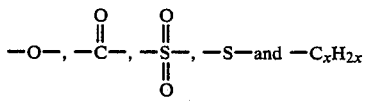

where x is a whole number from 1 to 5 inclusive.

Particulary preferred polyetherimides for the purposes of the present invention include those where —O—A< and Z respectively are:

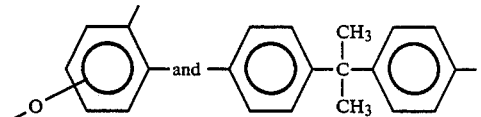

and R is selected from:

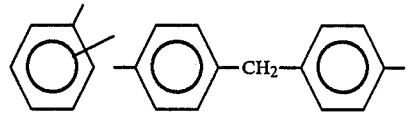

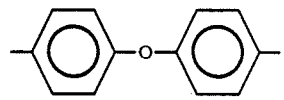

The polyetherimides where R is metaphenylene are most preferred.

Those thermoplastics which can withstand the elevated temperatures of the sputtering process and, particularly, of soldering, without distorting or decomposing are suitable for use in the process of the present invention. Smooth thermoplastics having glass transition temperatures exceeding 100° C. are preferred for use in the present invention; those having glass transition temperatures exceeding 150° C. are more preferred. Preferred polyetherimides will have glass transition temperatures exceeding 200° C., and most preferably exceeding 215° C.

The polyetherimides can be obtained by any of the methods well known to those skilled in the art including the reaction of any aromatic bis(ether anhydrides) of the formula

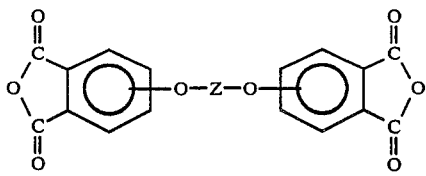

where Z is as defined hereinbefore, with an organic diamine of the formula

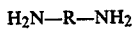

where R is as defined hereinbefore.

Aromatic bis(ether anhydride)s of the above formula include, for example, 2,2-bis[4-2,3-dicarboxyphenoxy)-phenyl]propane dianhydride; 4,4'-bis(2,3-dicarboxyphenoxy)diphenyl ether dianhydride; 1,3-bis(2,3-dicarboxyphenoxy)benzene dianhydride; 4,4'-bis(2,3-dicarboxyphenoxy)diphenyl sulfide dianhydride; 1,4'-bis(2,3-dicarboxyphenoxy)benzene dianhydride; 4,4'-bis(2,3-dicarboxyphenoxy)benzophenone dianhydride; 4,4'-bis(2,3-dicarboxyphenoxy)diphenyl sulfone dianhydride; etc., 2,2-bis[4-(3,4-dicarboxyphenoxy)phenyl]-propane dianhydride; 4,4'-bis(3,4-dicarboxyphenoxy)-diphenyl ether dianhydride; 4,4'-bis(3,4-dicarboxyphenoxy)diphenyl sulfide dianhydride; 1,3-bis(3,4-dicarboxyphenoxy)benzene dianhydride; 1,4-bis(3,4-dicarboxyphenoxy)benzene dianhydride; 4,4'-bis(3,4-dicarboxyphenoxy)benzophenone dianhydride; 4-(2,3-dicarboxyphenoxy)-4'-(3,4-dicarboxy- phenoxy)diphenyl-2,2-propane dianhydride; etc., and mixtures of such dianhydrides.

In addition, aromatic bis(ether anhydride)s also included by the above formula are shown by Koton, M. M.; Florinski, F. S.; Bessonov, M. I.; Rudakokv, A. P. (Institute of Heteroorganic Compounds, Academy of Sciences, U.S.S.R.), U.S.S.R. 257,010, Nov. 11, 1969, Appl. May 3, 1967. Also, dianhydrides are shown by M. M. Koton, F. S. Florinski, Zh Org. Khin, 4(5), 774 (1968).

Organic diamines of the above formula include, for example, m-phenylenediamine, p-phenylenediamine, 4,4'-diaminodiphenyl propane, 4,4'-diaminodiphenyl methane, benzidine, 4,4'-diaminodiphenyl sulfide, 4,4'-diaminodiphenyl sulfone, 4,4'-diaminodiphenyl ether, 1,5-diaminonaphthalene, 3,3'-dimethylbenzidine, 3,3'-dimethoxybenzidine, 2,4-bis(-amino-t-butyl)toluene, bis(p-beta-amino-t-butylphenyl)ether, bis(p-methyl-o-aminophenyl)benzene, 1,3-diamino-4-isopropylbenzene, 1,2-bis(3-aminopropoxy)ethane, m-xylylenediamine, p-xylylenediamine, 2,4-diaminotoluene, 2,6-diaminotoluene, bis(4-aminocyclohexyl)methane, 3-methylheptamethylenediamine, 4,4-dimethylheptamehtylenediamine, 2,11-dodecanediamine, 2,2-dimethylpropylenediamine, octamethylenediamine, 3-methoxyhexamethylenediamine, 2,5-dimethylhexamethylenediamine, 2,5-dimethylheptamethylenediamine, 3-methylheptamethylenediamine, 5-methylnonamethylenediamine, 1,4-cyclohexanediamine, 1,12-octadecanediamine, bis(3-aminopropyl)sulfide, N-methyl-bis(3-aminopropyl)amine, hexamethylenediamine, heptamethylenediamine, nonamethylenediamine, decamethylenediamine, bis(3-aminopropyl)tetramethyldisiloxane, bis(4-aminobutyl)tetramethyldisiloxane, etc.

In general, the reactions can be advantageously carried out employing well-known solvents, e.g., o-dichlorobenzene, m-cresol/toluene, etc., to effect interaction between the dianhydrides and the diamines, at temperatures of from about 100° to about 250° C. Alternatively, the polyetherimides can be prepared by melt polymerization of any of the aforementioned dianhydrides with any of the aforementioned diamine compounds while heating the mixture of the ingredients at elevated temperatures with concurrent intermixing. Generally, melt polymerization temperatures between about 200° to 400° C., and preferably 230° to 300° C., can be employed.

Included among the many methods of making the polyetherimides are those disclosed in Heath et al., U.S. Pat. Nos. 3,847,867, Williams, 3,847,869, Takekoshi et al., 3,850,885, and White, 3,852,242 and 3,855,178. These disclosures are incorporated herein in their entirety by reference for the purpose of teaching, by way of illustration, general and specific methods for preparing polyetherimides suitable for the composites of this invention.

Particularly preferred polyetherimides for the compositions of the present invention are represented by the formula:

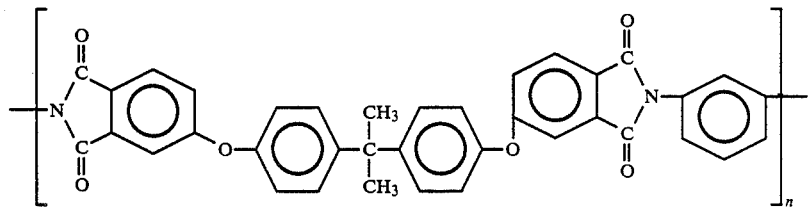

wherein "n" is an integer ranging from about 10 to about 100. This material is commercially available from General Electric Company, Pittsfield, Mass. under the registered trademark, ULTEM ®.

The bismaleimide resins suitable for use in the present invention generally are made by reacting a polymaleimide, e.g. 4-4'-bismaleimide, with an alkenylphenol or alkenylphenol ether, as disclosed in Zahir et al., U.S. Pat.No. 4,100,140 and they are available from Ciba Geigy, Ardsley, New York, U.S.A.

The polyether ether ketones suitable for use in the present invention are tough crystalline thermoplastics containing the recurring units of the formula:

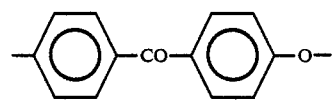

and/or recurring units of the formula:

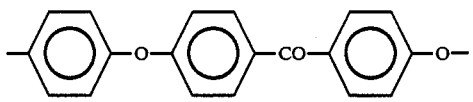

either singly or together with other recurring units and are described in Rose, et al., U.S. Pat. No. 4,320,224 and are available commercially from Imperial Chemical Industries, Ltd., London, England.

While in many cases, as has been mentioned, a mask is not necessary, if used, the mask material employed in the process of the present invention can be any mask material which satisfies the following requirements: the material can be releasably adhered to the substrate and for the sputtering conditions which effect imbedding and impregnation of the sputtered metal into the substrate surface the integrity of the negative pattern is maintained. Thus, the masking material will not substantially soften or flow from the sides of the channels of the negative pattern onto the exposed surfaces of the substrate thereby interrupting the deposition of the sputtered metal onto and into the substrate surface. Preferably, the masking material will be one which is further characterized in that it is essentially not imbedded with or impregnated by the sputtered metal.

Satisfactory mask materials include the strippable thermographic inks disclosed in Piazza, U.S. Pat. Nos. 4,157,936 and 4,243,700, which may be applied to the substrate by any of the well-known techniques such as offset printing, screen printing, gravure printing and the like. Also included in the contemplated practice of the present invention are foils or films of metallics or non-metallics which may be through-inscribed with the negative of the desired deposition pattern and releasably adhered to the substrate surface. Even simple masking materials such as common masking tape and the like have proved to be satisfactory masking materials for certain applications.

The metal to be employed in the present invention can be any conductive metal as previously defined which is capable of being sputtered. The preferred metals are copper, silver, gold, copper/aluminum alloys, stainless steel, brass, aluminum, chromium or titanium. Especially preferred is copper.

Although unmodified thermoplastic resins, and in particular the unmodified polyetherimide resins herein described, can be used in the practice of the present invention, it is often desirable to improve the strength characteristics of the composites by including in the thermoplastic a reinforcing amount of any one of the many reinforcing agents which are well-known in the thermoplastic art. These modifying reinforcing agents serve to improve the strength of the composites of the present invention and are especially desirable where the sputtered metallic pattern is deposited on one of the surfaces of a three-dimensional molded part and thus becomes an integral portion of the finished product, or, for that matter, in any application where the improved strength of the composite is necessary or desired.

The preferred reinforcing material will be selected from glass fibers, carbon fibers, glass beads or mixtures thereof. These materials are well known in the thermoplastic resin art, and the first two are widely used as reinforcements for structural materials. Compositions for lower performance applications can be obtained without using a reinforcing material; however, the strength and durability of the composite is substantially improved by including such materials. Glass fibers are the most common reinforcing agents, and are preferred for the compositions of the present invention because of their low cost and the desirable properties they impart to the compositions. The glass fibers which may be employed in this composition are generally so-called "chopped" strands which contain strands having average lengths from about 3 to about 6 mm. Longer strands tend to increase the abrasiveness of the composites whereas shorter strands do not impart the desired strength to the composite. Preferred glass fibers have average strand lengths of approximately 3 mm. In addition, the strands are advantageously relatively fine, and have diameters ranging from about 5 to about 15 microns, preferably about 10 microns.

Carbon fibers are employed for the production of extremely tough and durable resin composites. Such composites are finding a wide variety of applications ranging from the sporting goods to the aerospace industry. The cost of carbon fibers is presently considerably higher than that of glass fibers, therefore, generally their use would be limited to those applications where their superior properties outweigh the higher costs. The carbon fibers which may be employed in the compositions have strand lengths generally ranging from about 0.4 mm to about 6 mm and diameters ranging from about 5 to about 25 microns. Carbon fibers presently available are produced either by the so called "pitch" or "PAN" methods. Fibers made by either of these procedures can be employed in the present compositions; however, fibers made by the pitch method have been found superior and are preferred for the present invention.

Glass beads can also be used as reinforcing materials and can be substituted in whole or in part for glass or carbon fibers. Glass beads are commercially available in a wide range of particle sizes, and those beads having particle sizes ranging from about 1 to about 55 microns generally can be employed. Preferred glass beads have particle sizes ranging from about 5 to about 45 microns.

The total amount of reinforcing material used in the present compositions can range from zero to about 70% by weight of the total thermoplastic/reinforcing agent composition. Preferred concentrations for glass fibers range from about 5% by weight to about 40% by weight of the composition and preferably are about 25% by weight of the composition. Preferred ranges for carbon fibers range from about 5% by weight to about 30% by weight with a preferred concentration of about 10% by weight of the composition. Preferred ranges for glass beads range from about 5% by weight to about 40% by weight with a preferred concentration of about 20% by weight of the composition.

DESCRIPTION OF THE PREFERRED EMBODIMENT

A three-dimensional article which will be the substrate is injection-molded from ULTEM ®. A series of throughholes are strategically located therein. A tape mask is applied so as to mask all of substrate surface except the selected pattern over which the metal will be deposited and any of the through-holes to be through-deposited.

The prepared article is placed in a Balzers Sputtering Unit BAS 450 which contains a copper target metal. The chamber is evacuated and back-filled with argon gas, the argon gas is ionized to a plasma with suitable direct voltage. The ionized gas bombards the copper metal target, ejecting copper atoms in a direction opposite to the direction of impact of the plasma onto the target. The copper atoms impact upon the substrate, the energy of bombardment causes the copper atoms deposited during the initial stages of the process to become embedded into the surface of the exposed substrate and thus impregnate it. Subsequent deposition of copper takes place directly onto the embedded copper metal. The thickness of the copper which is deposited is controlled by a combination of factors; i.e., the potential applied to the ionized gas and the length of time the substrate is exposed to bombardment by the metal. In this manner, copper is deposited to a thickness in excess of 800 Angstroms. During deposition of the copper metal, the surface temperature of the exposed substrate is raised to in excess of 200° C. by the energy of bombardment caused by the impact of the copper metal onto the substrate surface.

After the sputter-deposition of the copper metal, the substrate is removed from the sputtering chamber and there is a firmly adherent and substantially uniform layer of copper metal deposited in a selected pattern on the exposed substrate surface and through the exposed through-holes.

At this point the three-dimensional substrate is exposed to a futher deposition of copper by any of the electroless deposition techniques well-known in the art.

The mask is then removed leaving the substrate upon which is deposited a firmly adherent copper pattern on both sides of the substrate, connected by plated through-holes.

The preceding procedure is modified, and a mask is not used. The desired circuitry is cut into the tool or mold and the article is formed. It comes out of the injection mold with the pattern impressed into it. Sputtering is then accomplished, and the entire article is metal coated. The raised area is removed by mechanical abrasion (scuff-sanding) and the electrically conductive pattern remains.

The foregoing patents and publications are incorporated herein by reference. Many variations of the present invention will suggest themselves to those skilled in this art in light of the above, detailed description. For example, the composites of the present invention can be used in high performance components and a single linear sputtered metallic deposit can be used to test the structural integrity of such components by passing a current therethrough to check whether the electrical continuity of the deposit is maintained. Instead of injection molding, compression molding, stamping, mechanical or chemical scrubbing can be used. All such variations are within the full intended scope of the invention as defined in the appended claims.

What is claimed is:

1. An article of manufacture comprising:
   (I) a molded, solderable, thermoplastic resin substrate having at least two smooth surfaces;
   (II) a firmly adherent and substantially uniform layer of at least one conductive metal deposited in a selected circuit pattern on at least one of said surfaces by sputtering; and, optionally,
   (III) 0% to 70% of a reinforcement contained in the substrate.

2. An article as recited in claim 1 wherein the substrate is arc-shaped.

3. An article as recited in claim 1 wherein the substrate is a profiled three-dimensional structure.

4. An article as recited in claim 1 wherein the substrate is provided with at least one through-hole connecting at least two of said smooth surfaces and a firmly adherent and substantially uniform metal layer is sputter-deposited into and through at least one through-hole and on each of the surfaces connected by said through-hole.

5. An article as recited in claim 1 wherein the substrate is a polyetherimide, a bismaleimide or a polyether ether ketone resin.

6. An article as recited in claim 1 further comprising:
   (IV) an amount of a metal deposited on said firmly adherent and substantially uniform sputter-deposited metal by electroless plating or electrodeposition.

7. An article as recited in claim 6 wherein the metal deposited by electroless plating or by electrodeposition is copper.

8. An article as recited in claim 1 wherein, in cross-sectional view through the plane of any of said surfaces on which there is a metal deposited in a selected circuit pattern, said surface immediately adjacent to said metal remains essentially smooth and unaltered, and at least a portion of said metal is embedded into and impregnates said surface.

9. An article of manufacture comprising:
   (I) a solderable substrate having at least two smooth surfaces comprising polyetherimide resin of the formula

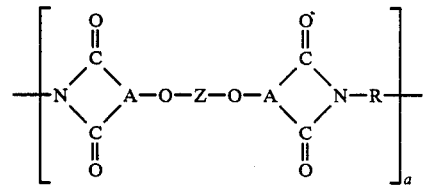

wherein "a" represents a whole number from about 10 to about 10,000, the group —O—A< is selected from:

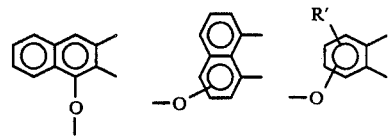

wherein R' is hydrogen, lower alkyl or lower alkoxy; Z is a member of the class consisting of (1)

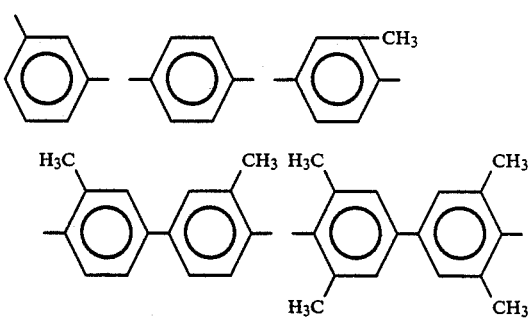

-continued

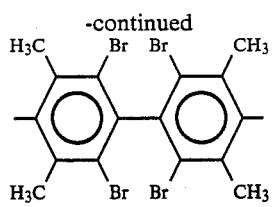

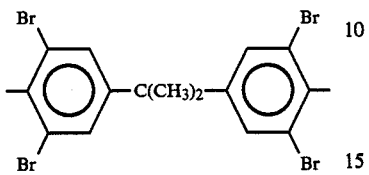

and (2) divalent organic radicals of the general formula

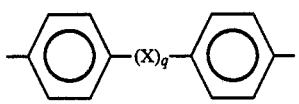

where X is a member selected from the class consisting of divalent radicals of the formula

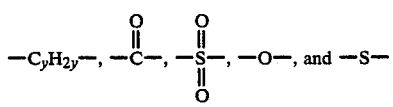

where q is 0 or 1, y is a whole number from 1 to 5, and R is a divalent organic radical selected from the class consisting of (1) aromatic hydrocarbon radicals having from 6 to 20 carbon atoms and halogenated derivatives thereof, (2) alkylene radicals and cycloalkylene radicals having from 2-20 carbon atoms, $C_{(2-8)}$ alkylene-terminated polydiorganosiloxane, and (3) divalent radicals of the formula:

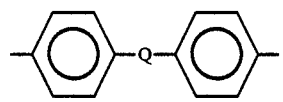

where Q is a member selected from the class consisting of

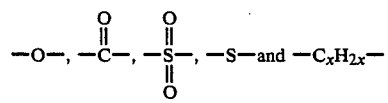

where x is a whole number from 1 to 5 inclusive;
(II) a firmly adherent and substantially uniform layer of at least one conductive metal deposited in a selected circuit pattern on said substrate by sputtering; and, optionally, (III) 0% to 70% of a reinforcing agent in the substrate selected from glass fibers, carbon fibers, glass beads or mixtures thereof.

10. An article as recited in claim 9, wherein the group —O—A< is

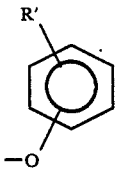

11. An article as recited in claim 10, wherein Z is

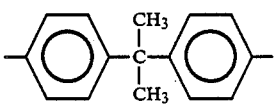

and R' is

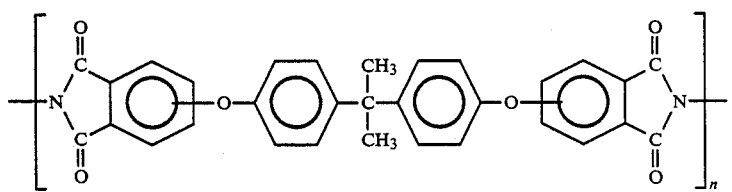

12. An article as recited in claim 9 wherein the polyetherimide resin is of the formula:

wherein n is an integer from 10 to about 100.

13. An article as recited in claim 12, wherein the metal sputtered onto the substrate is copper.

14. An article as recited in claim 9, wherein the polyetherimide resin has a glass transition temperature of at least about 200° C.

15. An article as recited in claim 9 wherein the polyetherimide resin has a glass transition temperature of at least about 215° C.

16. An article as recited in claim 9 wherein the conductive metal sputtered onto the substrate is selected from copper, silver, gold, aluminum, chromium, titanium, brass, stainless steel or copper/aluminum alloys.

17. An article as recited in claim 9, wherein the optional reinforcing agent (III) is chopped glass fibers.

18. An article as recited in claim 17, wherein the glass fibers have chopped strands with average lengths of from about 3 mm to about 6 mm and average diameters of from about 5 microns to about 15 microns and wherein said glass fibers are present at a concentration from about 5% by weight to about 40% by weight of the polyetherimide/glass fiber composition.

19. An article as recited in claim 9, wherein the optional reinforcing agent (III) is chopped carbon. fibers.

20. An article as recited in claim 19, wherein the carbon fibers have strands of average lengths of from about 0.4 mm to about 6 mm and average diameters of from about 5 microns to about 25 microns and wherein said carbon fibers are present at a concentration from about 5% by weight to about 30% by weight of the polyetherimide/carbon fiber composition.

21. An article as recited in claim 9 wherein the optional reinforcing agent (III) is glass beads.

22. An article as recited in claim 24, wherein the glass beads have an average particle size of from about 1 to about 53 microns, and wherein said glass beads are present at a concentration of from about 5% by weight to about 40% by weight of the polyetherimide/glass bead composition.

23. An article of manufacture comprising:
(I) a molded polyetherimide substrate having at least two smooth surfaces wherein there is provided at least one through-hole connecting at least two of said smooth surfaces, wherein said polyetherimide is comprised of the formula:

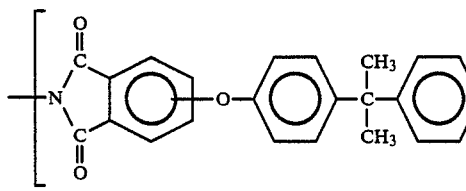

wherein "n" is an integer from 10 to about 100;
(II) a firmly adherent and substantially uniform copper layer sputter-deposited into and through at least one through-hole and in a selected circuit pattern on each of the surfaces connected by said through-hole; and
(III) a further amount of copper is deposited on said sputter-deposited layer by electroless plating or by electro-deposition.

24. A process for depositing a metal pattern on a smooth, solderable, thermoplastic substrate comprising sputtering a conductive metal in a selective pattern under sputtering conditions which provide a firmly adherent and substantially uniform deposited metal pattern on the substrate.

25. A process for depositing a metal pattern as recited in claim 24, including the steps of:
(a) releasably adhering to the substrate a mask material which exhibits the negative of the metal pattern to be produced;
(b) sputtering a conductive metal onto the masked substrate under sputtering conditions which provide a firmly adherent and substantially uniform deposited metal pattern on the substrate; and
(c) removing said mask.

26. A process as recited in claim 25 wherein the solderable thermoplastic substrate comprises a polyetherimide resin, a bismaleimide resin, or a polyether ether ketone.

27. A process as recited in claim 26 wherein the polyetherimide resin is of the formula:

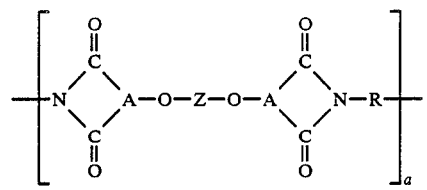

wherein "a" represents a whole number from about 10 to about 10,000, the group —O—A is selected from:

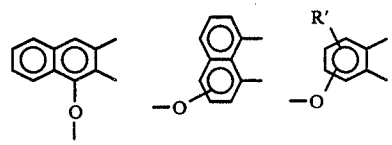

wherein R' is hydrogen, lower alkyl or lower alkoxy; Z is a member of the class consisting of (1)

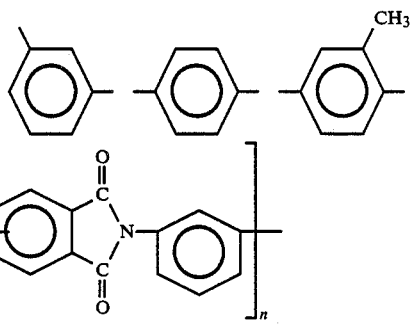

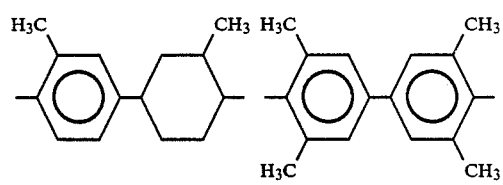

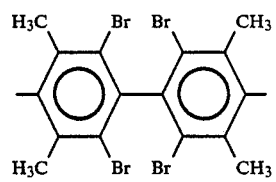

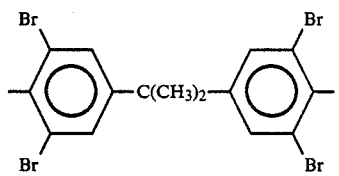

and (2) divalent organic radicals of the general formula

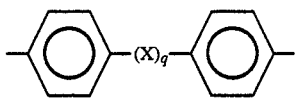

where X is a member selected from the class consisting of divalent radicals of the formula

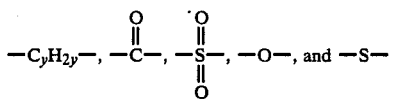

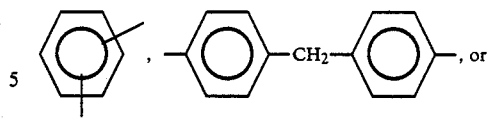

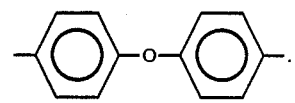

30. A process as recited in claim 29 wherein the polyetherimide resin is of the formula:

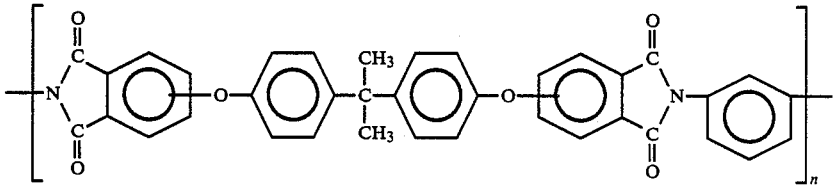

where q is 0 or 1, y is a whole number from 1 to 5, and R is a divalent organic radical selected from the class consisting of (1) aromatic hydrocarbon radicals having from 6 to 20 carbon atoms and halogenated derivatives thereof, (2) alkylene radicals and cycloalkylene radicals having from 2-20 carbon atoms, $C_{(2-8)}$ *alkylene terminated polydiorganosiloxane, and* (3) divalent radicals of the formula

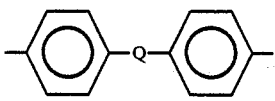

where Q is a member from the class consisting of

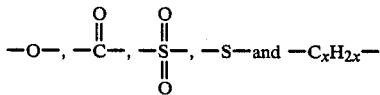

where x is a whole number from 1 to 5 inclusive.

28. A process as recited in claim 27 wherein the group —O—A< is

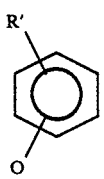

29. A process as recited in claim 28, wherein Z is

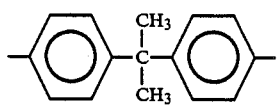

and R is

31. A process as recited in claim 28 wherein the metal is copper.

32. A process as recited in claim 25 wherein the substrate and mask temperatures during the sputtering step (b) are from about 200° C. to about 215° C.

33. A process as recited in claim 26 wherein the substrate and mask temperatures during sputtering step (b) are not substantially less than the glass transition temperature of the polyetherimide, bismaleimide or polyether ether ketone substrate.

34. A process as recited in claim 27 wherein, in an optional step (b)', a second metal is sputterdeposited onto the metal sputter-deposited in step (b).

35. A process as recited in claim 34 wherein, in a second optional step (b)' before step (c), or in an optional step (d) after step (c), a metal is deposited onto the sputtered metal by electroless plating or by electroplating.

36. A process as recited in claim 35, wherein the metal deposited by electroless plating or by electroplating is copper.

37. A process as recited in claim 27 wherein, in an optional step (b)' before step (c), or in an optional step (d) after step (c), a metal is deposited onto the sputtered metal by electroless plating or by electroplating.

38. A process as recited in claim 37, wherein the metal deposited by electroless plating or by electroplating is copper.

39. A process as recited in claim 26 wherein the sputtered metal is selected from copper, silver, gold, brass, aluminum, chromium, titanium, stainless steel, aluminum/copper alloys or mixtures of any of the foregoing.

40. A process as recited in claim 25 wherein the substrate and mask temperatures during the sputtering step (b) are from about 100° C. to about 215° C.

41. A process as recited in claim 25 wherein the substrate and mask temperatures during the sputtering step (b) are from about 150° C. to about 215° C.

42. An article comprising a three-dimensional electrically conductive and directly solderable circuit component made by the process of claim 24.

* * * * *